(12) United States Patent
Sugar

(10) Patent No.: US 7,190,733 B2
(45) Date of Patent: Mar. 13, 2007

(54) MEMORYLESS SPECTRUM CORRECTION ALGORITHM FOR NON-IDEAL I/Q DEMODULATORS

(75) Inventor: Gary L. Sugar, Bethesda, MD (US)

(73) Assignee: Cognio, Inc., Germantown, MD (US)

( * ) Notice: Subject to any disclaimer, the term of this patent is extended or adjusted under 35 U.S.C. 154(b) by 0 days.

(21) Appl. No.: 11/280,404

(22) Filed: Nov. 17, 2005

(65) Prior Publication Data

US 2006/0153318 A1    Jul. 13, 2006

Related U.S. Application Data (60) Provisional application No. 60/629,917, filed on Nov. 22, 2004.

(51) Int. Cl.
    *H04L 5/12*      (2006.01)

(52) U.S. Cl. ............... 375/261; 375/324; 375/340; 375/346; 329/304; 329/349; 329/351; 455/285; 455/302

(58) Field of Classification Search ......... 375/261, 375/264, 268, 269, 272, 273, 279, 285, 320, 375/322–324, 329, 334, 340, 344, 346, 350; 329/303, 304, 306, 308, 315, 345–347, 349, 329/351; 455/283, 285, 305, 326
See application file for complete search history.

(56) References Cited

U.S. PATENT DOCUMENTS

| | | | | |
|---|---|---|---|---|
| 6,560,449 | B1 * | 5/2003 | Liu | ............................. 455/302 |
| 6,725,023 | B2 * | 4/2004 | Kasperkovitz | ............... 455/205 |
| 6,765,623 | B1 | 7/2004 | Parker | |
| 6,778,594 | B1 * | 8/2004 | Liu | ............................. 375/222 |
| 2003/0231726 | A1 * | 12/2003 | Schuchert et al. | |

OTHER PUBLICATIONS

Liu et al. "A Spectral Correction Algorithm for I-Q Channel Imbalance Problem", 2001 IEEE, pp. 334-338.

* cited by examiner

*Primary Examiner*—Dac V. Ha
(74) *Attorney, Agent, or Firm*—Edell, Shapiro & Finnan, LLC (57) ABSTRACT

An algorithm for correcting the output of an analog I/Q demodulator without the need for calibration or storing state information. The output of the analog I/Q demodulator is digitized, and the discrete-time samples are divided into segments. A digital frequency transform (e.g., a Discrete Fourier Transform) is computed for each segment. The effects of the non-ideal I/Q demodulator are removed by identifying a set of image frequency candidates for each digital frequency transform, and for each image frequency candidate, estimating a set of demodulator imbalance parameters to characterize the demodulator imbalance at that frequency and correcting the digital frequency transform at the image frequency candidate using the imbalance parameters in order to minimize the effects of the imbalance. Each digital frequency transform is corrected independently and consequently no persistent state information needs to be saved between transforms.

18 Claims, 12 Drawing Sheets

PRIOR ART

MEMORYLESS SPECTRUM CORRECTION ALGORITHM FOR NON-IDEAL I/Q DEMODULATORS

RELATED APPLICATIONS

This application claims priority to U.S. Provisional Application No. 60/629,917, filed Nov. 22, 2004, the entirety of which is incorporated herein by reference.

BACKGROUND OF THE INVENTION

The present invention relates to radio receiver devices, and more particularly to techniques for correcting for inaccuracies in in-phase/quadrature-phase (I/Q) demodulators.

Figure 1:
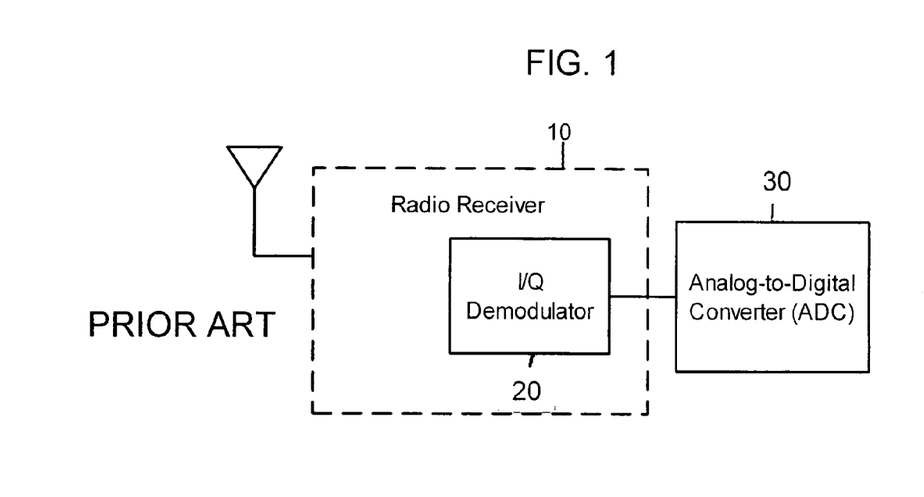
FIG. 1 is a block diagram of a radio receiver having an analog I/Q demodulator.
Figure 2:
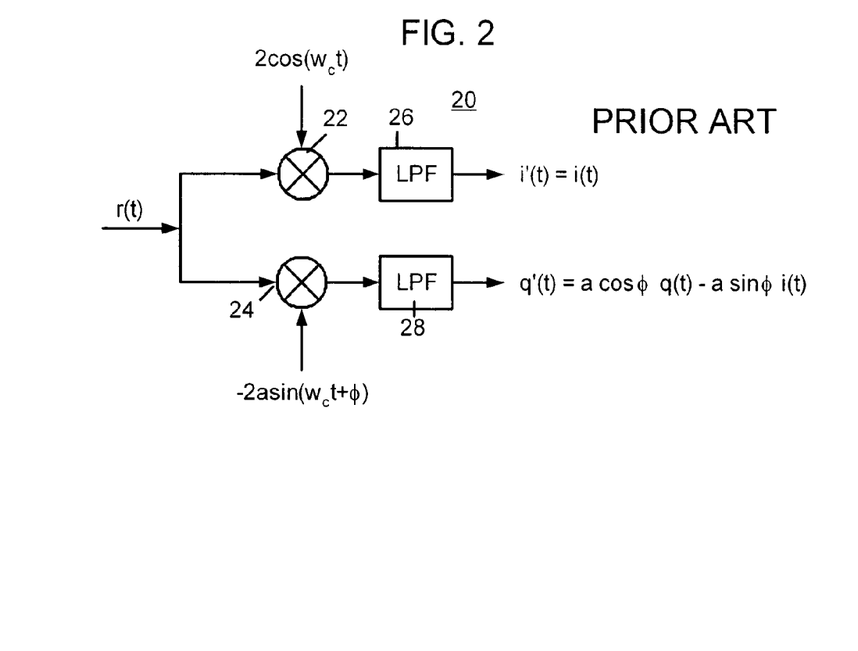
FIG. 2 is a block diagram of an exemplary analog I/Q demodulator.

As shown in FIG. 1, low-cost receivers 10 for wireless digital communications systems typically use an analog I/Q demodulator 20 to downconvert received RF signals to baseband before the signal is converted to digital data by an analog-to-digital converter (ADC) 30 and is processed digitally. An example of an I/Q demodulator 20 is shown in FIG. 2 and comprises an in-phase mixer 22 and a quadrature-phase mixer 24, and associated low pass filters 26 and 28. An I/Q demodulator never exhibits perfect quadrature and amplitude balance between the I and Q paths, causing image artifacts to appear at the negative of the input signal frequency as shown in FIG. 2.

State-of-the-art I/Q demodulator implementations typically provide an image suppression of 35–40 dB, which is sufficient to guarantee acceptable performance in most applications. However, for real-time spectrum management applications where it is desired to detect the types of signals occurring in a shared frequency band, the required image suppression is much larger than 35 dB. In fact, in some cases an image suppression of approximately 90 dB is required. Image artifacts above the noise floor make spectrum analysis displays confusing. In addition, signal classification and pulse detection functions can be confused by the image artifacts if they are not properly removed.

There are several known techniques for mitigating the image artifacts inherently created by non-ideal I/Q demodulators. According to one technique, an intermediate frequency (IF)-based receiver is used and digital I/Q demodulation is performed at IF. The drawback of this technique is that IF receivers can only be implemented using discrete analog circuits. Another technique involves using calibration to measure the amplitude and phase imbalance of the I/Q modulator and correct for the imbalances digitally. The problems with this technique are that it can only provide up to 65 dB of suppression over temperature, and a relatively long calibration time is required at manufacture.

Still another approach is to use a complex very low intermediate frequency (VLIF)-based receiver. With this approach, however, out-of-band signals can appear as if they were in-band, still requiring calibration to minimize this effect.

An improved approach for removing the effects of I/Q demodulator imbalance is needed that is efficient and flexible to implement, and capable of providing significant image suppression required for certain communication applications, such as spectrum analysis or management applications.

SUMMARY OF THE INVENTION

Briefly, the output of an analog I/Q demodulator is digitized, the discrete-time samples are divided into segments, and a digital frequency transform (e.g., a Discrete Fourier Transform) is computed for each segment. The effects of the non-ideal I/Q demodulator are removed by identifying a set of image frequency candidates for each digital frequency transform, and for each image frequency candidate, estimating a set of demodulator imbalance parameters to characterize the demodulator imbalance at that frequency and correcting the digital frequency transform at the image frequency candidate using the imbalance parameters in order to minimize the effects of the imbalance.

In this algorithm, no calibration is required. Each digital frequency transform is corrected independently and consequently no persistent state information needs to be saved between transforms. The image artifacts are attenuated into the noise floor of each input transform such that the amount of image suppression is always sufficient.

The above and other advantages of this technique will become more apparent when reference is made to the following description taken in conjunction with the accompanying drawings.

BRIEF DESCRIPTION OF THE DRAWINGS

FIGS. 9A, 9B, 9C through 13A, 13B, 13C are screen shots of plots taken from simulations that illustrate performance of the correction algorithm described herein.

DETAILED DESCRIPTION

Figure 3:
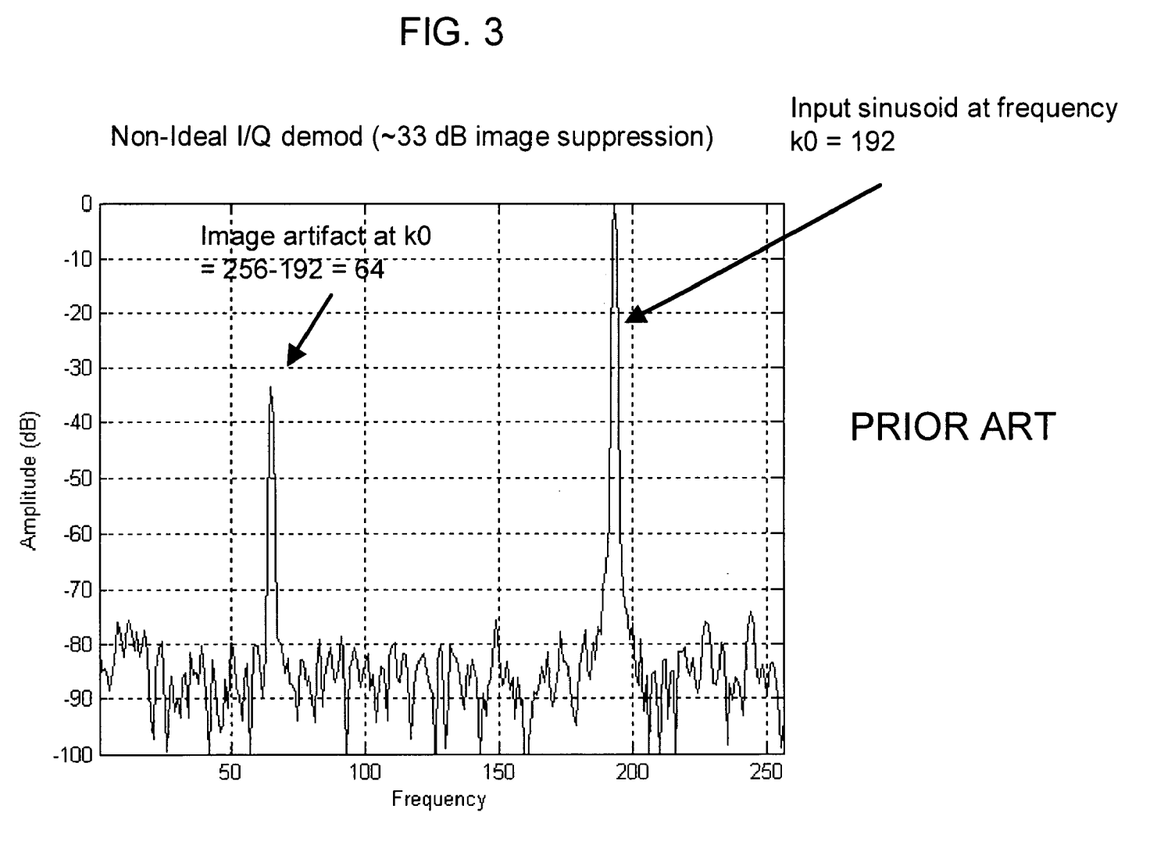
FIG. 3 is an amplitude versus frequency plot showing a typical image artifact produced when an I/Q demodulator demodulates an exemplary signal.

An I/Q modulated RF signal has the form.

$$r(t) = i(t)\cos \omega_c t - q(t)\sin \omega_c t$$

where $i(t)$=in-phase signal, $q(t)$=quadrature signal, $\omega_c$=carrier frequency. FIG. 3 shows a non-ideal I/Q demodulator with amplitude error $a$ and phase error $\phi$. When $r(t)$ is applied at the input, the complex baseband output of this circuit can be shown to be $$y(t) = \frac{1+\alpha}{2} s(t) + \frac{1-\alpha^*}{2} s^*(t) \quad (1)$$

where $$\alpha = a \cdot e^{-j\phi} \text{ and } s(t) = i(t) + jq(t)$$

A discrete-time version of equation (1) can be written as:

$$y_n = \frac{(1+\alpha)}{2} s_n + \frac{(1-\alpha^*)}{2} s_n^* \quad (2)$$

Applying a window function $W_n$ to equation (2) gives $$y_n = \frac{(1+\alpha)}{2} s_n \cdot w_n + \frac{(1-\alpha^*)}{2} s_n^* \cdot w_n \quad (3)$$

Taking N-point digital Fourier transforms (DFTs) of both sides of equation (3) yields $$Y_k = \frac{(1+\alpha)}{2} \cdot \sum_{m=0}^{N-1} S_m W_{mod(k-m,N)} + \frac{(1-\alpha^*)}{2} \cdot \sum_{m=0}^{N-1} S_m^* W_{mod(k+m,N)} \quad (4)$$

Assuming $s_n = X \cdot e^{j2\pi nk0/N}$,
then, $S_k = X \cdot \delta(k-k0)$ and equation (4) becomes $$Y_k = \frac{(1+\alpha)}{2} \cdot X \cdot W_{mod(k-k0,N)} + \frac{(1-\alpha^*)}{2} \cdot X^* \cdot W_{mod(k+k0,N)}$$

The image suppression at the demodulator output (in dB) is $$Y_k = 20 \cdot \log \left| \frac{Y_{k0}}{Y_{-k0}^*} \right| = 20 \cdot \log \left| \frac{1+\alpha}{1-\alpha} \right|$$

An arbitrary finite-length signal has a unique DFT, and can therefore be written as a sum of sinusoids:

$$S_n = \sum_{k=0}^{N-1} X_k \cdot e^{2\pi jnk/N} \text{ with a } DFT \text{ of } S_k = \sum_{m=0}^{N-1} X_m \cdot \delta(k-m)$$

Figure 4:
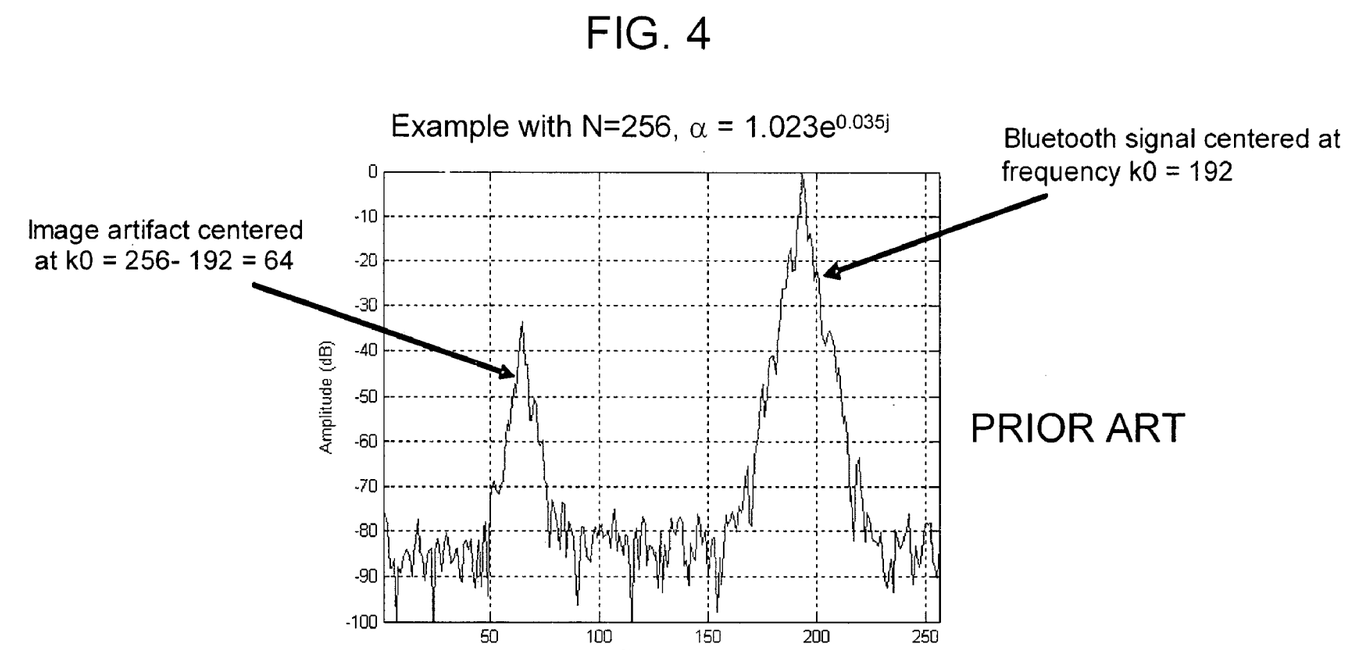
FIG. 4 is an amplitude versus frequency plot showing an image artifact produced when an I/Q demodulator demodulates a Bluetooth™ signal pulse.

FIG. 4 shows an example of an image artifact being created when a Bluetooth™ center at a particular center frequency is demodulated.

In this case, equation (4) becomes $$Y_k = \frac{(1+\alpha)}{2} \cdot \sum_{m=0}^{N-1} X_m W_{mod(k-m,N)} + \frac{(1-\alpha^*)}{2} \cdot \sum_{m=0}^{N-1} X_m^* W_{mod(k+m,N)} \quad (5)$$

Since the DFT window spectrum $W_k$ is conjugate symmetric, equation (4) can be rewritten as follows:

$$Y_k = \frac{(1+\alpha)}{2} \tilde{S}_k + \frac{(1-\alpha^*)}{2} \tilde{S}_{-k}^* \quad (6)$$

where $$\tilde{S}_k = \sum_{m=0}^{N-1} S_m W_{mod(k-m,N)} \quad (7)$$

Both sides of equation (6) can be conjugated to solve for $S_k$ in terms of $Y_k$ as follows:

$$\tilde{S}_k = \gamma \cdot (Y_k - \beta \cdot Y_{-k}^*) \quad (8A)$$

where $$\beta = \frac{1-\alpha^*}{1+\alpha^*}$$

and $$\gamma = \frac{1+\alpha^*}{\alpha + \alpha^*}.$$

The spectrum correction algorithm is motivated from the observation that in equations (6) and (7), the spectrum $Y_k$ at the non-ideal demodulator output is conjugate symmetric at the image frequencies, i.e., $$S_k \approx 0 \text{ and } |S_{-k}| >> 0 \Rightarrow Y_k = \beta \cdot Y_{-k}^* \text{ for some } \beta$$

Figure 5:
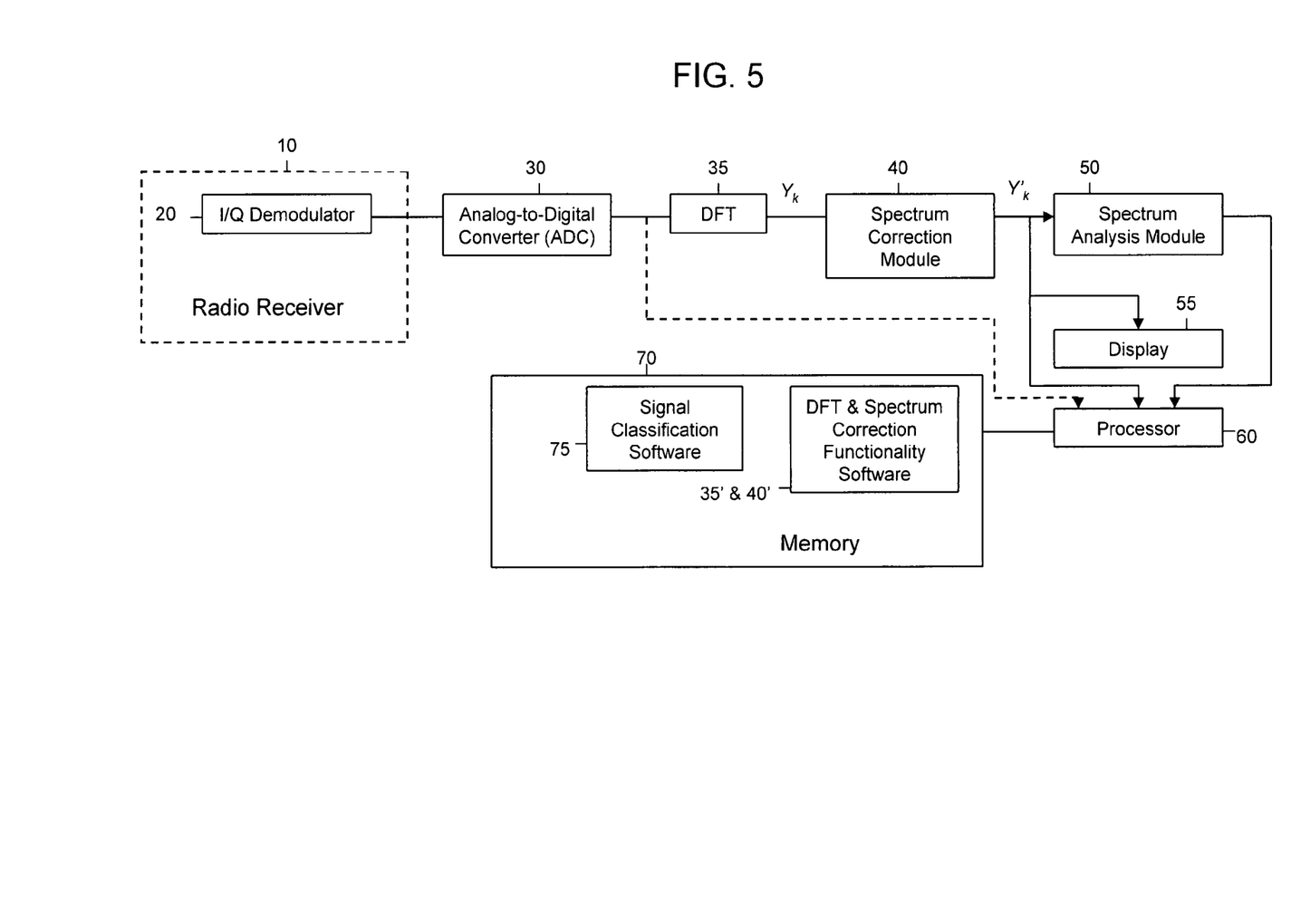
FIG. 5 is a block diagram of a receiver system having a spectrum correction module that performs the correction algorithms described herein to suppress image artifacts produced by the I/Q demodulator.

Turning to FIG. 5, a receiver system is shown comprising a radio receiver 10 having an analog I/Q demodulator 20, an ADC 30, a Discrete Fourier Transform (DFT) module 35 and a spectrum correction module 40 that performs the spectrum correction algorithm described herein. The ADC 30 digitizes the output of the demodulator 20 and forms discrete-time samples that are divided into segments. The DFT module 35 generates a discrete Fourier transform of each segment, and the discrete Fourier transform is analyzed by the spectrum correction module 40 as described below. The output of the spectrum correction module 40 may coupled to a spectrum analysis module 50 which in turn is coupled to a microprocessor (processor) 60. An example of a spectrum analysis module is a real-time spectrum analysis engine (SAgE) disclosed in commonly assigned U.S. Pat. No. 6,714,605, issued Mar. 30, 2004 and in commonly assigned co-pending U.S. application Ser. No. 10/909,450, filed Aug. 2, 2004.

In addition, the output for the spectrum correction module 40 may be coupled to a display 55 for displaying the corrected spectrum information. The processor 60 may perform analysis functions on the output of the spectrum analysis module 50 based on software stored in the memory 70. For example, the processor 60 may execute signal classification software 75 to analyze the corrected spectrum data from the spectrum correction module and/or pre-analyzed by the spectrum analysis module 50, to classify one or more types of signals occurring in the received signal.

The DFT module 35 and the spectrum correction module 40 may be implemented in hardware or firmware (fixed or programmable digital logic gates) configured to operate on the output of the ADC 30 and perform the functions described herein. Alternatively, the DFT and spectrum correction functions may be performed in software by DFT and spectrum correction functionality software 35' and 40' stored in the memory 70 and executed by the processor 60. In this case, the output of the ADC 30 would be coupled to the processor 60.

Figure 6:
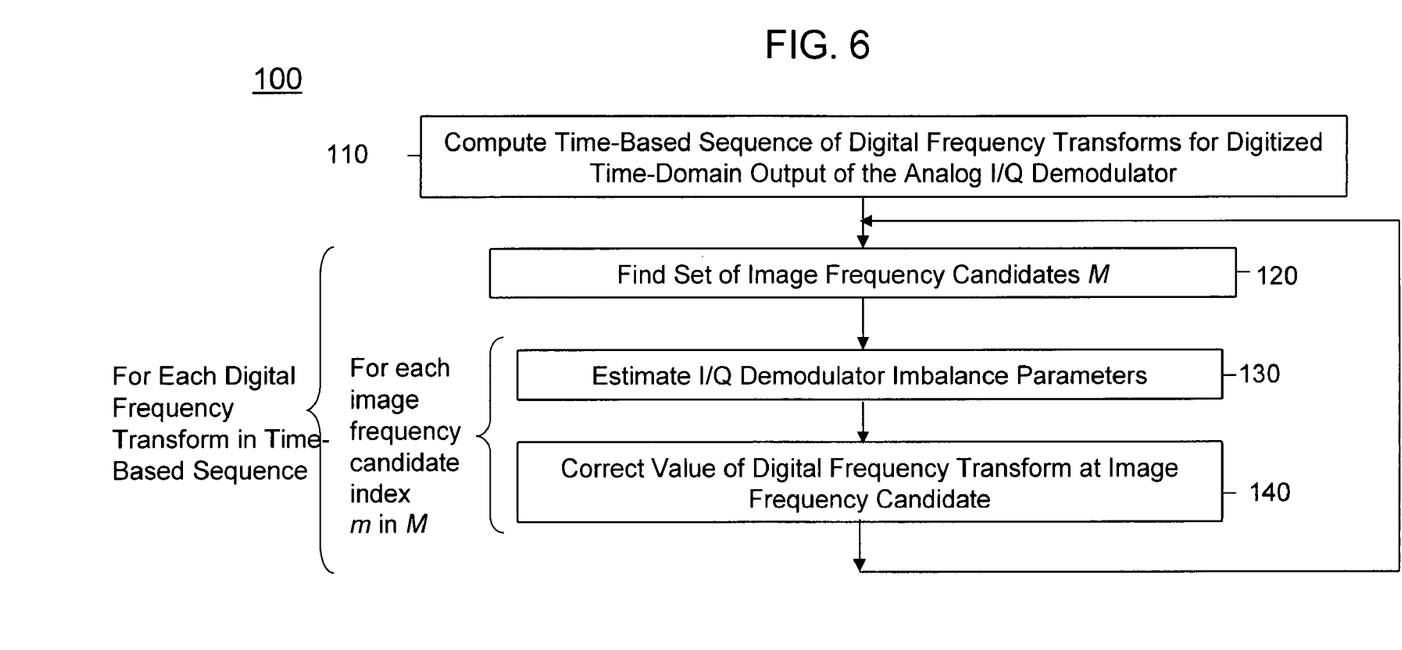
FIG. 6 is a flow chart depicting certain steps of the spectrum correction algorithm.

With reference to FIG. 6, the spectrum correction algorithm 100 will be described. In step 110, the output of the analog I/Q demodulator is digitized by the ADC 30, the discrete-time samples are divided into segments, and a digital frequency transform (e.g., Discrete Fourier Transform) is computed for each segment, thereby forming a time-based sequence of digital frequency transforms. For example, a discrete Fourier Transform, $Y_k$, k=0, . . . , N−1, is computed for each buffer segment of discrete-time samples. As an example, N is 256. The DFT $Y_k$ is copied to an output buffer $Y'_k$.

The effects of the non-ideal I/Q demodulator are removed by identifying a set of image frequency candidates for each digital frequency transform. For each image frequency candidate, a set of demodulator imbalance parameters are estimated to characterize the demodulator imbalance at that frequency and used to correct the digital frequency transform at the image frequency candidate in order to minimize the effects of the imbalance.

More specifically, in step 120, a set M of image frequency candidates are found using the computation described below in connection with equation (9). At a frequency of the DFT corresponding to each image frequency candidate, there may be a signal that is an image of the input signal to the analog I/Q demodulator at the negative frequency. Thus, for each image frequency candidate m in M, steps 130 and 140 are performed. In step 130, a set of I/Q demodulator imbalance parameters are estimated to minimize an appropriately defined cost function as explained hereinafter in conjunction with equations (10) and (11). That is, the I/Q demodulator imbalance parameters are estimated such that when applied to correct the value of the digital frequency transform at the image frequency candidate in step 140, it has the effect of removing a component of the digital frequency transform that is the image of a signal at the negative frequency and leaving the rest of the digital frequency transform unaltered. The set of I/Q demodulator imbalance parameters are γ and β referred to above and α and γ are computed from β using the relationship:

$$\alpha = \frac{1-\beta^*}{1+\beta^*},$$

$$\gamma = \frac{1+\alpha^*}{\alpha+\alpha^*}$$

In the correction step 140, $Y'_m$ is overwritten with the corrected value for the digital frequency transform according to equation (8B), where $Y_m$ is the complex DFT value at candidate image frequency m and $Y^*_{-m}$ is the complex conjugate of $Y_{-m}$:

$$Y'_m = \gamma(Y_m - \beta Y_{-m}^*) \quad (8B)$$

In the correction step 140, if $Y_m$ appears as an image of a narrow-band signal, such as a tone, then $Y'_m = 0.5*(Y_{m-1} + Y_{m+1})$, the average of the value of digital frequency transform at the neighboring image frequency candidates on both sides of candidate image frequency m. In the foregoing explanation, the DFT is an example of the type of digital frequency transform with which the algorithm may be used.

Once steps 130 and 140 have been performed for each of the image frequency candidates m in M, the process repeats from step 110 with the digital frequency transforms of the next input buffer. Subtracting out or removing of the image frequency candidate from the digital frequency transform occurs if the image candidate is actually an image, or does not occur if the image candidate is not an image but actually is signal, occurs in step 140. Moreover, unlike prior techniques, this algorithm accounts for frequency dependence and is stateless. In addition, the method described herein involves estimating where the image frequencies are without a priori knowledge of them.

The set M of image frequency candidates M are found in step 120 by comparing the ratio of signal to image power in the DFT computed from the demodulator output spectrum:

$$M = \{0 \leq m < N : |Y_m| < 10^{-25/20} |Y_{-m}|\} \quad (9)$$

where m is a particular candidate image frequency in M, and $|Y_{-m}|$ is the signal amplitude at the negative frequency. In other words, the image candidates have a signal power that is at least a predetermined amount lower, e.g., 25 dB, than the signal power at the negative frequency. This threshold is motivated from the fact that most analog I/Q demodulators have at least 30 dB image suppression.

The cost function used in step 130 may be defined with two goals in mind:
1. Find the multiplier β to best make Y "appear conjugate symmetric" at the image frequencies.
2. Account for frequency dependence in β because in practice, the amplitude and phase offset of a typical analog I/Q demodulator varies in-band over frequency due to (a) amplitude and group delay skew in the I and Q lowpass filters, and (generally to a lesser extent) (b) amplitude and phase variation in the cos( ) and sin( ) function generators feeding the mixers. For certain spectrum analysis applications, it has been determined that the offset remains constant over roughly 2 MHz of the 20 MHz output bandwidth.

The cost function is defined mathematically as follows:

$$J(\beta) = \sum_{p \in W(m,M)} |Y_p - \beta Y_{-p}^*|^2 \quad (10)$$

where $$W(m, M) = \left\{ p \in M \text{ and } |p-m|\frac{f_s}{N} < 2 \text{ MHz} \right\}.$$

In other words, the sum in equation (10) is carried out over all candidates in M that are within 2 MHz of the candidate m at which spectrum correction is being applied.

By taking derivatives and equating to zero, the minimizer of equation (10) can be shown to be:

$$\hat{\beta} = \frac{\sum_{p \in W(m,M)} Y_p Y_{-p}}{\sum_{p \in W(m,M)} |Y_{-p}|^2} \quad (11)$$

To summarize, the spectrum correction algorithm described above involves, on a per-digital frequency transform basis, finding a set of image frequency candidates m, and for each image frequency candidate, estimating the I/Q demodulator imbalance parameters that make the digital frequency transform look as it would if it came from an ideal analog demodulator. That is, at each image frequency candidate, the algorithm estimates a set of I/Q demodulator imbalance parameters (β and γ), and then correction is applied at the image frequency candidate m using equation (8B). Thus, the estimated I/Q demodulator imbalance parameters are frequency dependent, or more specifically image frequency candidate dependent. The I/Q demodulator imbalance parameters are computed using the cost function of equation (10) such that when applied to an image frequency candidate using equation (8B), it either removes the image frequency candidate if it actually is an image and leaves the digital frequency transform otherwise unaffected, or it leaves it unaltered if it is not an image.

Thus, if the step of identifying an image frequency candidate wrongly flags a frequency of the DFT as being an image candidate, e.g., there really is not an image artifact at frequency m, but rather just another signal that happens to be 25 or more dB lower than the signal at the negative frequency, the algorithm will not alter the DFT data at that frequency.

Suppose an I/Q demodulator has an amplitude and phase imbalance characterized by which α is estimated using the spectrum correction algorithm described above. The following explains how much image suppression the algorithm should deliver.

If m is an image frequency, then from equation (6)

$$Y_m = \frac{1-\alpha^*}{2}\tilde{S}^*_{-m}$$

and $$Y^*_{-m} = \frac{1+\alpha^*}{2}\tilde{S}^*_{-m}$$

and the image suppression of the uncorrected I/Q demodulator is $$20 \cdot \log\left|\frac{Y^*_{-m}}{Y_m}\right| = 20 \cdot \log\left|\frac{1+\alpha^*}{1-\alpha^*}\right| \text{ dB}$$

Figure 8A:
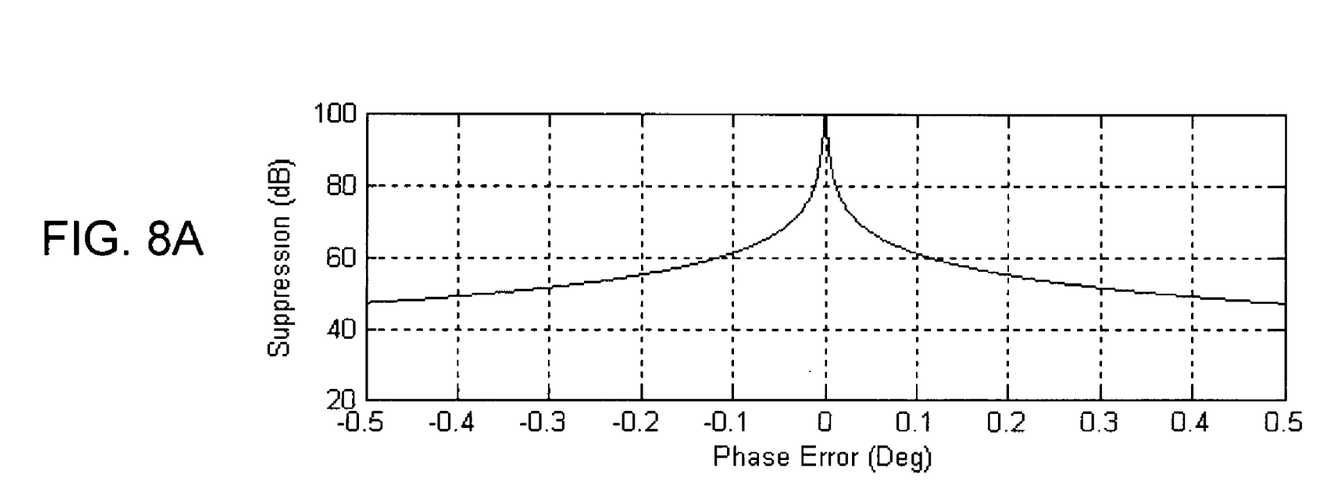
FIGS. 8A and 8B show plots for output suppression as a function of estimated amplitude and phase error after correction.
Figure 8B:
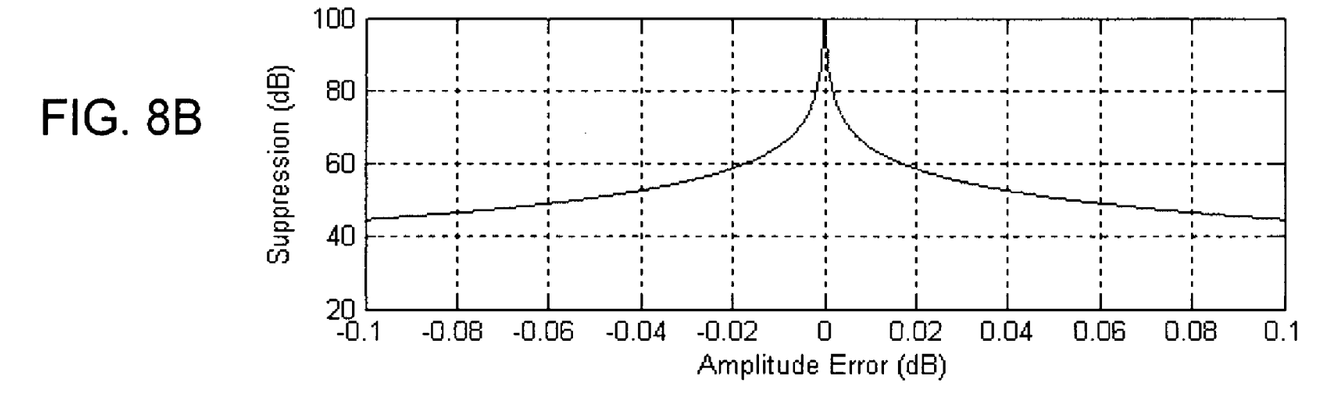

Substituting the above formulas for $Y_m$ and $Y_{-m}^*$ in equation (8B), it can be shown that the image suppression after correction is $$20 \cdot \log\left|\frac{Y'^*_{-m}}{Y'_m}\right| = 20 \cdot \log\left|\frac{(1+\alpha)\text{Re}(\hat{\alpha})}{(\hat{\alpha}-\alpha)}\right| \text{ dB} \quad (12)$$

where $$\hat{\alpha} = \frac{1-\hat{\beta}^*}{1+\hat{\beta}^*},$$

and $\hat{\beta}$ is the estimate of the actual β obtained using steps 130 and 140. The plots in FIGS. 8A and 8B show the output suppression in equation (12) as a function of estimated amplitude error 20·log|α/α̂| and phase error arg (α/α̂).

Figure 7:
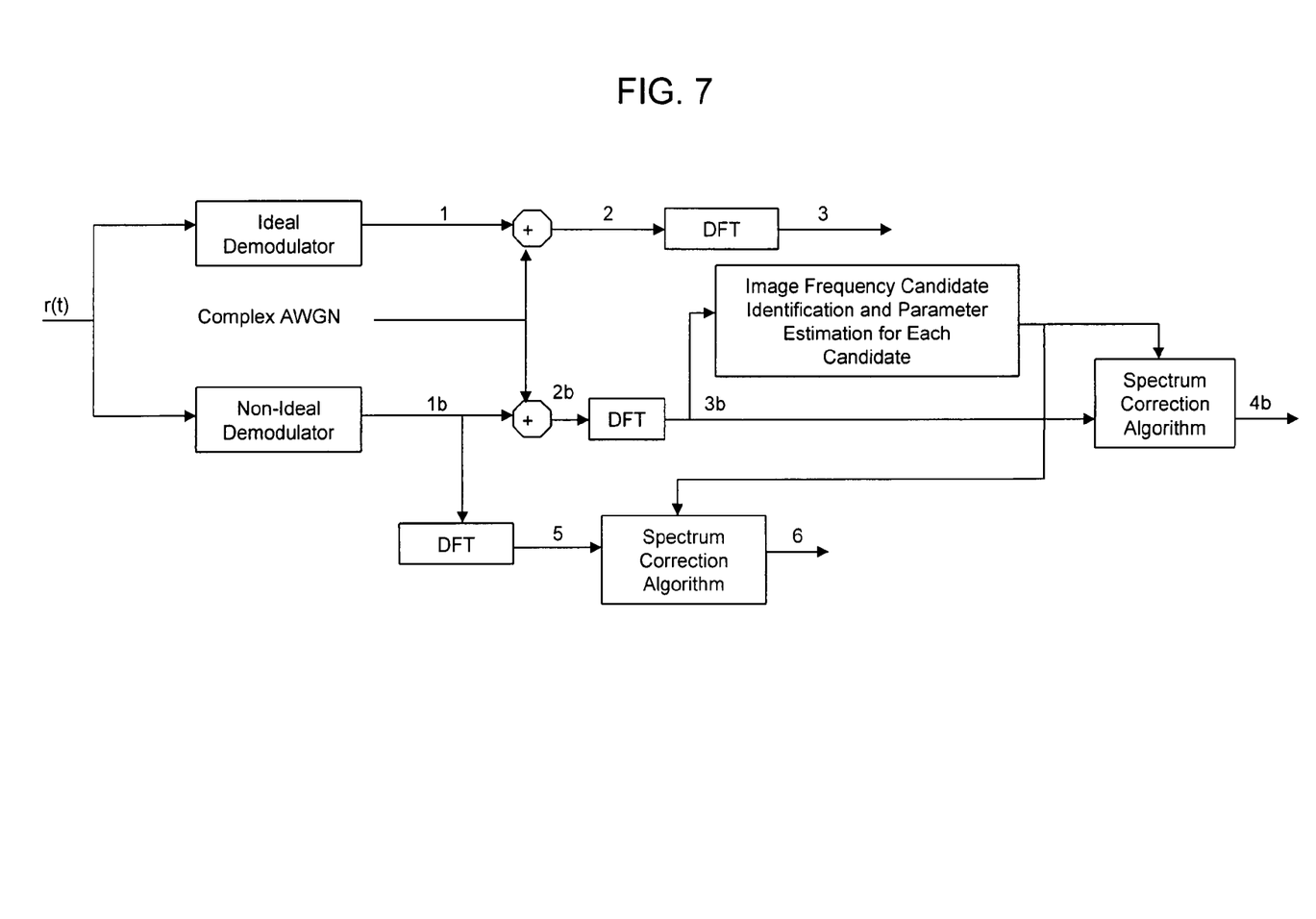
FIG. 7 is a block diagram of a simulation environment used to measure the performance of the spectrum correction algorithm described herein.

Examples of the performance of the spectrum correction algorithm are shown in FIGS. 9A, 9B, 9C through 13A, 13B, 13C. FIG. 7 illustrates a simulation set-up that was used to make the measurements on the signals shown in FIGS. 9A, 9B, 9C through 13A, 13B, 13C. Specifically, the received signal, r(t), was run in two different paths, one involving a so-called "ideal" demodulator and the other involving a non-ideal demodulator, and in particular, an I/Q demodulator having an α value determined to be 0.9387 (30 dB image suppression). Signal 1 is the output of the ideal demodulator which is then subjected to additive white Gaussian noise (AWGN) to form signal 2 when is then analyzed by a discrete Fourier transform block to produce signal 3. Image frequency candidates are determined for signal 3 using the techniques described above. Signal 3 is said to be undistorted because it is produced by an ideal demodulator.

Signal 1b is the output of the non-ideal demodulator and is also subjected to AWGN to produce signal 2b. Signal 2b is analyzed by a discrete Fourier transform block to produce a signal 3b. Image frequency candidates are determined for signal 3b using the techniques described above. Signal 3b is said to be distorted because it is produced by a non-ideal demodulator. Signal 3b is then analyzed by the spectrum correction algorithm described herein to produce corrected spectrum signal 4b. In addition, the output of the non-ideal demodulator is coupled to a discrete Fourier transform block to produce signal 5 which is then analyzed by the spectrum correction algorithm to produce a noiseless distorted corrected spectrum signal 6.

Figure 9A:
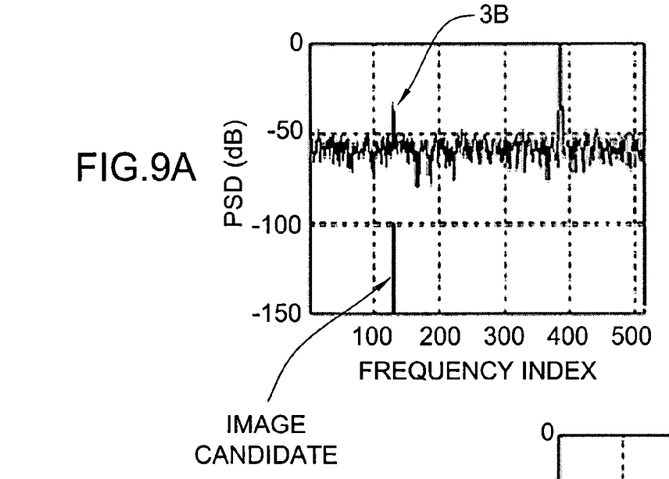
Figure 9B:
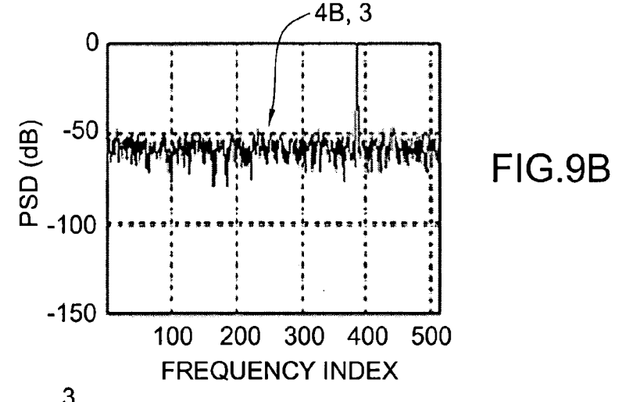
Figure 9C:
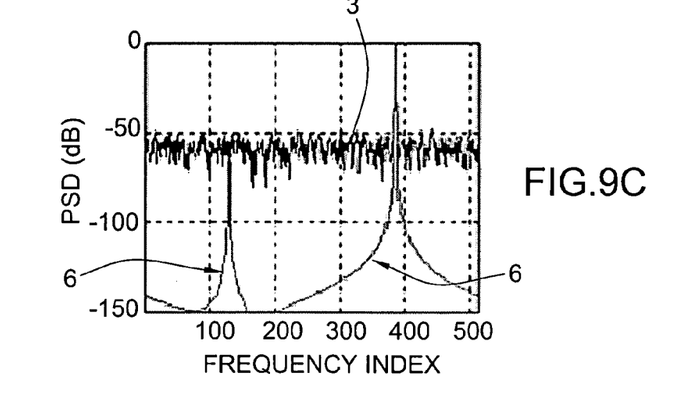

Thus, in FIGS. 9A, 9B, 9C through 13A, 13B, 13C, there are three plots that illustrate measurements on signals produced for simulations run with different types of input signals and DFT widths. Specifically, FIG. 9A illustrates a plot signal 3b, the distorted spectrum signal for a non-ideal demodulator where the input signal is a continuous wave (CW) at 5 MHz, sample frequency $f_s$=20 MHz, signal-to-noise ratio (SNR)=40 dB, and the DFT is a N=512 pt FFT. In addition, FIG. 9A illustrates the image frequency candidates identified from the signal 3b using the image frequency candidate identification techniques described herein. FIG. 9B illustrates the corrected spectrum signal 4b produced according to the techniques described herein and an undistorted spectrum signal for the ideal demodulator. FIG. 9C illustrates noiseless distorted corrected spectrum signal 6 and the undistorted spectrum signal 3 from the ideal demodulator. Note that FIG. 9C shows that the spectrum correction algorithm applied to the noise distorted signal gives only enough suppression to put the images into the noise, and no further.

Figures 10A, 10B, 10C:
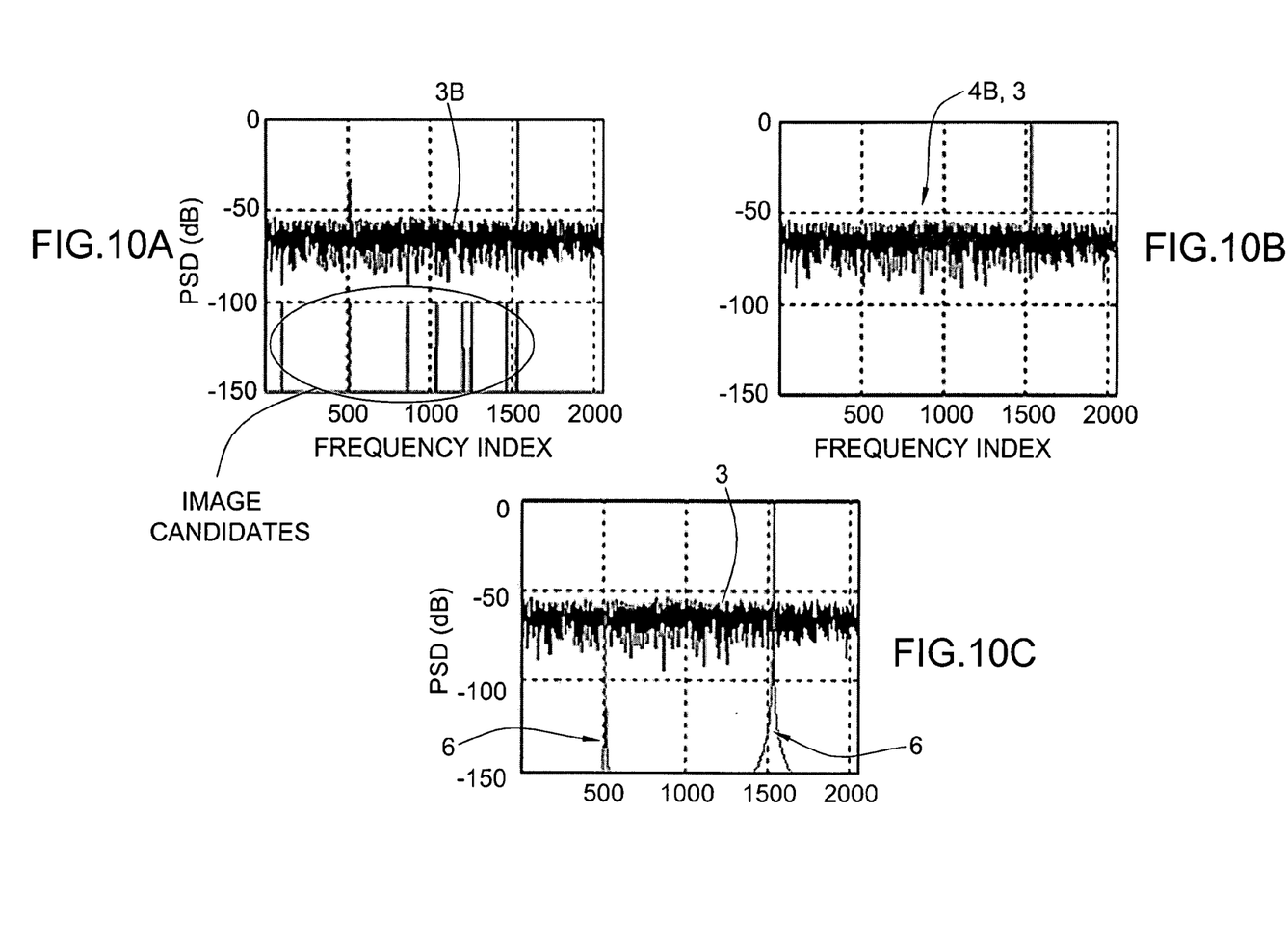

FIGS. 10A–10C are similar plots that show performance for similar conditions as FIGS. 9A–9D, except that the DFT is a N=2048 pt FFT.

Figures 11A, 11B, 11C:
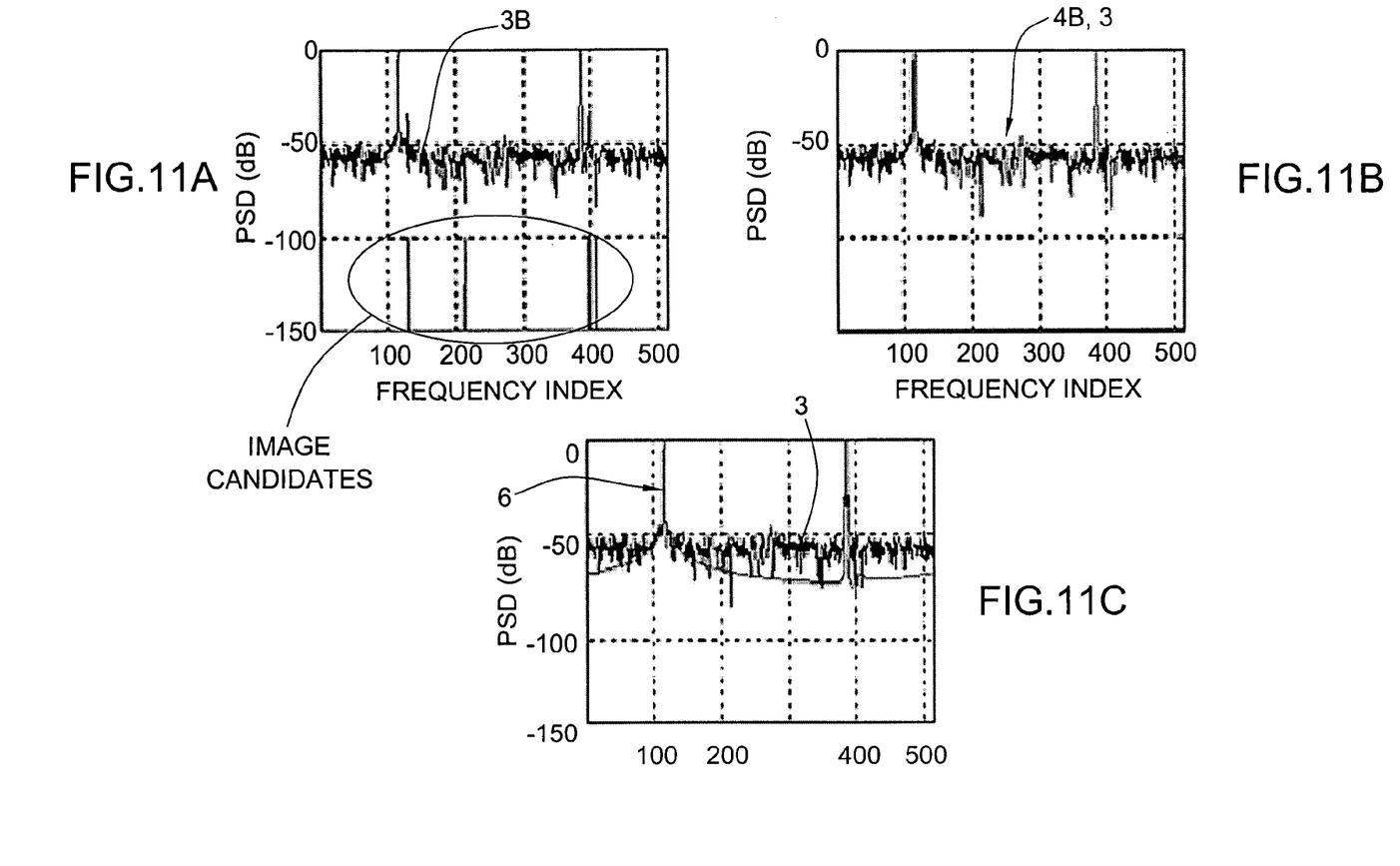

FIG. 11A–10C are similar plots that show performance of the spectrum correction algorithm when the input comprises CWs at 5 and −4.5 MHz, $f_s$=20 MHz, SNR=40 dB, and the DFT is a N=512 pt FFT.

Figures 12A, 12B, 12C:
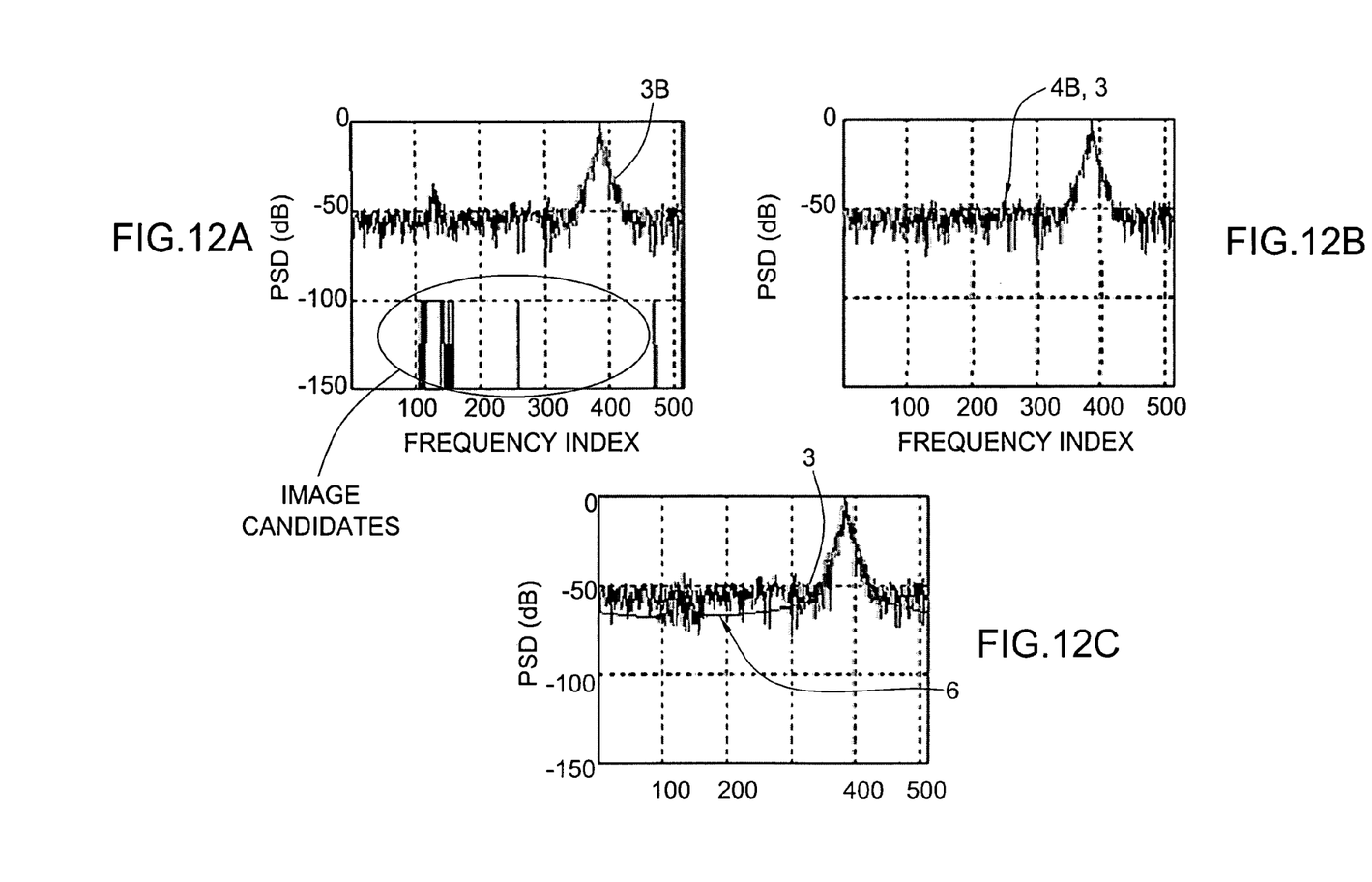

FIGS. 12A–12C are similar plots that show performance of the spectrum correction algorithm for an input Bluetooth pulse at 5 MHz, $f_s$=20 MHz, SNR=40 dB, the DFT is a N=512 pt FFT.

Figures 13A, 13B, 13C:
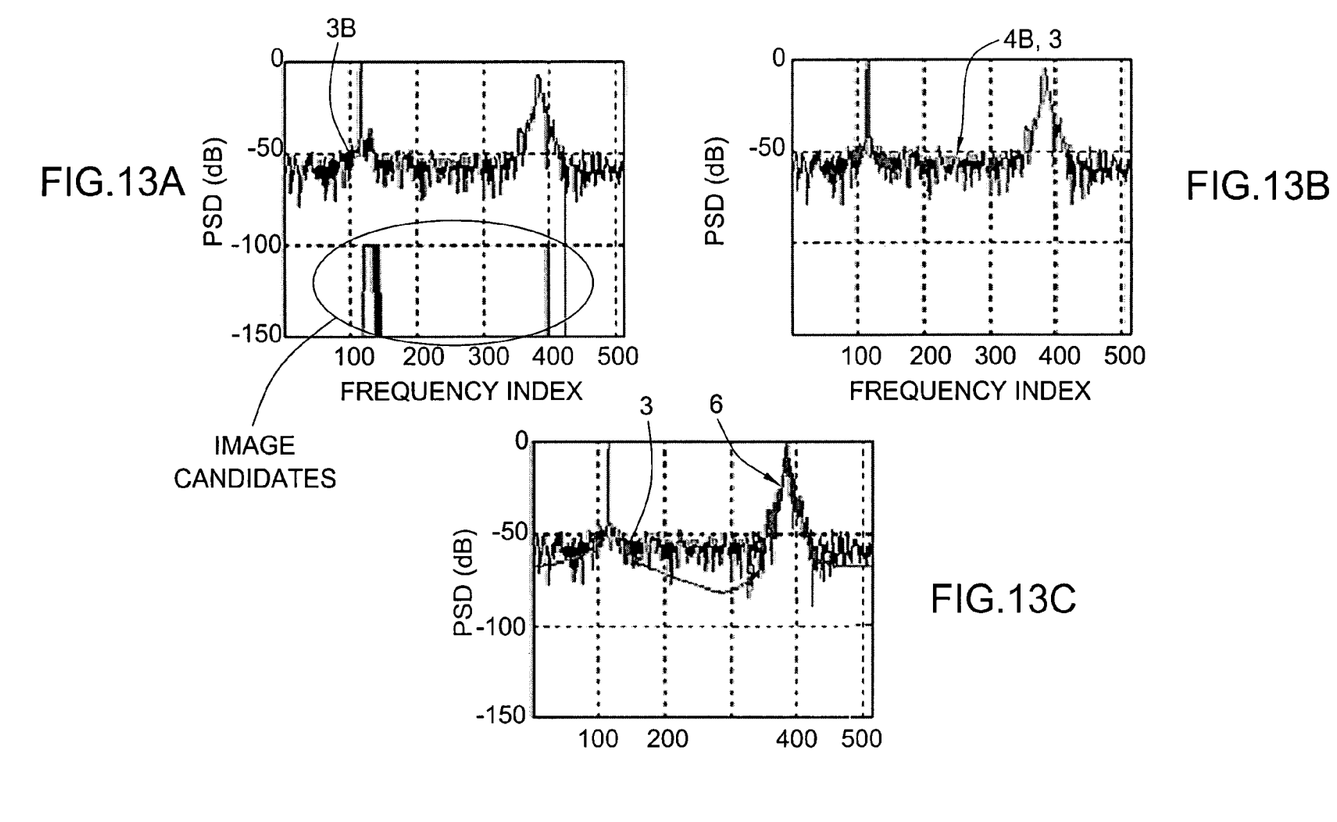

FIG. 13A–13C are similar plots that show performance of the spectrum correction algorithm for an input Bluetooth pulse at 5 MHz and an input CW at −4.5 MHz, $f_s$=20 MHz, SNR=40 dB, the DFT is a N=512 pt FFT.

The following observations were noted from the simulations for various SNRs, FFT sizes and input signals.

(1) Images are suppressed only enough to put them into the noise floor.
(2) Infinite image suppression is obtained as the input SNR goes to infinity.
(3) When the input signal is a tone, a small notch appears in the max-hold plot at the image frequencies. This is because the sum in equation (11) only has only a small number of terms carrying signal information, causing the estimator to suppress both image and noise, rather than just the image. This effect can be corrected by replacing the image corrected samples with interpolated samples on either side of the image.

In sum, a method is provided for correcting the output of an analog I/Q demodulator, comprising computing a time-based sequence of digital frequency transforms for the time-domain output of the I/Q analog demodulator; identifying a set of one or more image frequency candidates in the digital frequency transform, wherein at each image frequency candidate there may be a signal that is an image of the input signal to the analog I/Q demodulator at the negative frequency; for each image frequency candidate, estimating I/Q demodulator imbalance parameters; and correcting the value of the digital frequency transform at the image frequency candidate using the set of I/Q demodulator imbalance parameters.

Said another way, a method is provided for correcting the output of an analog I/Q demodulator, comprising computing a digital frequency transform for each sample of a time-based output of the analog demodulator; analyzing the digital frequency transform to identify image frequency candidates; and removing an image frequency candidate if it actually is an image, otherwise, not removing the image frequency candidate.

Said still another way, a method is provided for correcting the output of analog I/Q demodulator, comprising: converting the output of the analog I/Q demodulator to segments of discrete-time samples; computing a digital frequency transform for each segment of discrete-time samples; identifying a set of image frequency candidates for each digital frequency transform; for each image frequency candidate, estimating a set of demodulator imbalance parameters to characterize the demodulator imbalance at that frequency; and correcting the digital frequency transform at the image frequency candidate using the imbalance parameters in order to minimize the effects of the imbalance.

Said yet another way, a method is provided for correcting the output of an analog I/Q demodulator, comprising: computing a time-based sequence of digital frequency transforms for the time-domain output of the I/Q analog demodulator; identifying a set of one or more image frequency candidates in the digital frequency transform, wherein at each image frequency candidate there may be a signal that is an image of the input signal to the analog I/Q demodulator at the negative frequency; for each image frequency candidate, computing I/Q demodulator imbalance parameters such that the digital frequency transform is conjugate symmetric at the image frequency candidate; and correcting a value of the digital frequency transform at the image frequency candidate using the set of I/Q demodulator imbalance parameters, by computing $Y'_m = \gamma(Y_m - \beta Y_{-m}^*)$ where $Y_m$ is an uncorrected value of the frequency transform the image frequency candidate m and $Y'_m$ is the corrected value of the digital frequency transform at the image frequency candidate m, and where the set of I/Q demodulator imbalance parameters comprise $\gamma$ and $\beta$.

The techniques described herein may be embodied by instructions stored on a processor readable medium, including instructions that, when executed by a processor, cause the processor to: compute a time-based sequence of digital frequency transforms for the time-domain output of the I/Q analog demodulator; identify a set of one or more image frequency candidates in the digital frequency transform, wherein at each image frequency candidate there may be a signal that is an image of the input signal to the analog I/Q demodulator at the negative frequency produced by the analog I/Q demodulator; for each image frequency candidate, estimate I/Q demodulator imbalance parameters; and correct a value of the digital frequency transform at the image frequency candidate using the set of I/Q demodulator imbalance parameters. The processor so programmed may be part of a radio receiver system that also includes a radio receiver that receives radio frequency signals and includes an I/Q analog demodulator that demodulates the radio frequency signals to produce an analog baseband signal, and an analog-to-digital converter coupled to the radio receiver that converts the analog baseband signal to a digital signal.

The above description is intended by way of example only.

What is claimed is:

1. A method for correcting the output of an analog I/Q demodulator, comprising:
    a. computing a time-based sequence of digital frequency transforms for the time-domain output of the I/Q analog demodulator;
    b. identifying a set of one or more image frequency candidates in the digital frequency transform, wherein at each image frequency candidate there may be a signal that is an image of the input signal to the analog I/Q demodulator at the negative frequency;
    c. for each image frequency candidate, estimating I/Q demodulator imbalance parameters; and
    d. correcting the value of the digital frequency transform at the image frequency candidate using the set of I/Q demodulator imbalance parameters.

2. The method of claim 1, wherein (c) estimating comprises computing the I/Q demodulator imbalance parameters for the image frequency candidate such that when applied to the digital frequency transform at the image frequency candidate it has the effect of removing a component of the digital frequency transform that is the image of a signal at the negative frequency and leaving the rest of the digital frequency transform unaltered.

3. The method of claim 1, wherein (b) through (d) are performed for each digital frequency transform.

4. The method of claim 1, wherein (b) identifying comprises identifying a frequency of the frequency domain transform that has a power that is a predetermined amount lower than the power of the frequency domain transform at a corresponding negative frequency.

5. The method of claim 1, wherein (d) correcting comprises computing $Y'_m = \gamma(Y_m - \beta Y_{-m}^*)$, where $Y_m$ is an uncorrected value of the frequency transform at the image frequency candidate m and $Y'_m$ is the corrected value of the digital frequency transform at the image frequency candidate m, and where the set of I/Q demodulator imbalance parameters comprise $\gamma$ and $\beta$.

6. The method of claim 1, wherein if a value of the digital frequency transform at the image frequency candidate appears as an image of a relatively narrow-band signal, then correcting comprises computing $Y'_m$ as an average of the values of the digital frequency transform at neighboring image frequency candidates.

7. The method of claim 1, wherein (c) estimating comprises computing the I/Q demodulator imbalance parameters for an image frequency candidate such that the digital frequency transform is conjugate symmetric at the image frequency candidate.

8. A method for correcting the output of an analog I/Q demodulator, comprising:
    a. computing a digital frequency transform for each sample of a time-based output of the analog demodulator;
    b. analyzing the digital frequency transform to identify image frequency candidates; and
    c. removing an image frequency candidate if it actually is an image, otherwise, not removing the image frequency candidate.

9. A processor readable medium storing instructions that, when executed by a processor, cause the processor to:
   a. compute a time-based sequence of digital frequency transforms for the time-domain output of the I/Q analog demodulator;
   b. identify a set of one or more image frequency candidates in the digital frequency transform, wherein at each image frequency candidate there may be a signal that is an image of the input signal to the analog I/Q demodulator at the negative frequency produced by the analog I/Q demodulator;
   c. for each image frequency candidate, estimate I/Q demodulator imbalance parameters; and
   d. correct a value of the digital frequency transform at the image frequency candidate using the set of I/Q demodulator imbalance parameters.

10. The processor readable medium of claim 9, wherein the instructions that (c) estimate comprise instructions that compute the I/Q demodulator imbalance parameters for the image frequency candidate such that when applied to the digital frequency transform at the image frequency candidate it has the effect of removing a component of the digital frequency transform that is the image of a signal at the negative frequency and leaving the rest of the digital frequency transform unaltered.

11. The processor readable medium of claim 9, wherein (b) through (d) are performed for each digital frequency transform.

12. The processor readable medium of claim 9, wherein the instructions that (b) identify comprises instructions that identify a frequency of the frequency domain transform that has a power that is a predetermined amount lower than the power of the frequency domain transform at a corresponding negative frequency.

13. The processor readable medium of claim 9, wherein the instructions that (d) correct comprise instructions that compute $Y'_m = \gamma(Y_m - \beta Y_{-m}^*)$, where $Y_m$ is an uncorrected value of the frequency transform at the image frequency candidate m and $Y'_m$ is the corrected value of the digital frequency transform at the image frequency candidate m, and where the set of I/Q demodulator imbalance parameters comprise $\gamma$ and $\beta$.

14. The processor readable medium of claim 13, wherein the instructions that (d) correct comprise instructions that compute $Y'_m$ as an average of the values of the digital frequency transform at neighboring image frequency candidates if a value of the digital frequency transform at the image frequency candidate appears as an image of a relatively narrow-band signal.

15. The processor readable medium of claim 9, wherein the instructions that (c) estimate comprise instructions that compute the I/Q demodulator imbalance parameters for an image frequency candidate such that the digital frequency transform is conjugate symmetric at the image frequency candidate.

16. A radio receiver system, comprising:
   a. a radio receiver that receives radio frequency signals and includes an I/Q analog demodulator that demodulates the radio frequency signals to produce an analog baseband signal;
   b. an analog-to-digital converter coupled to the radio receiver that converts the analog baseband signal to a digital signal; and
   c. a processor coupled to the analog-to-digital converter that is programmable to:
      i. compute a time-based sequence of digital frequency transforms for the time-domain output of the I/Q analog demodulator;
      ii. identify a set of one or more image frequency candidates in the digital frequency transform, wherein at each image frequency candidate there may be a signal that is an image of the input signal to the analog I/Q demodulator at the negative frequency produced by the analog I/Q demodulator;
      iii. for each image frequency candidate, estimate I/Q demodulator imbalance parameters; and
      iv. correct a value of the digital frequency transform at the image frequency candidate using the set of I/Q demodulator imbalance parameters.

17. A method for correcting the output of an analog I/Q demodulator, comprising:
   a. computing a time-based sequence of digital frequency transforms for the time-domain output of the I/Q analog demodulator;
   b. identifying a set of one or more image frequency candidates in the digital frequency transform, wherein at each image frequency candidate there may be a signal that is an image of the input signal to the analog I/Q demodulator at the negative frequency;
   c. for each image frequency candidate, computing I/Q demodulator imbalance parameters such that the digital frequency transform is conjugate symmetric at the image frequency candidate; and
   d. correcting a value of the digital frequency transform at the image frequency candidate using the set of I/Q demodulator imbalance parameters, by computing computing $Y'_m = \gamma(Y_m - \beta Y_{-m}^*)$, where $Y_m$ is an uncorrected value of the frequency transform at the image frequency candidate m and $Y'_m$ is the corrected value of the digital frequency transform at the image frequency candidate m, and where the set of I/Q demodulator imbalance parameters comprise $\gamma$ and $\beta$.

18. A method for correcting the output of analog I/Q demodulator, comprising:
   a. converting the output of the analog I/Q demodulator to segments of discrete-time samples;
   b. computing a digital frequency transform for each segment of discrete-time samples;
   c. identifying a set of image frequency candidates for each digital frequency transform;
   d. for each image frequency candidate, estimating a set of demodulator imbalance parameters to characterize the demodulator imbalance at that frequency; and
   e. correcting the digital frequency transform at the image frequency candidate using the imbalance parameters in order to minimize the effects of the imbalance.

* * * * *